United States Patent [19]

Nakazato et al.

[11] Patent Number: 5,061,645

[45] Date of Patent: Oct. 29, 1991

[54] METHOD OF MANUFACTURING A BIPOLAR TRANSISTOR

[75] Inventors: Kazuo Nakazato, Kokubunji; Tohru Nakamura, Houya; Masatoshi Matsuda, Fuchu; Takao Miyazaki, Hachioji; Tokuo Kure, Kokunbunji; Takahiro Okabe, Nishitama; Minoru Nagata, Kodaira, all of Japan

[73] Assignee: Hitachi, Ltd., Tokyo, Japan

[21] Appl. No.: 498,489

[22] Filed: Mar. 26, 1990

Related U.S. Application Data

[60] Continuation of Ser. No. 196,064, May 17, 1988, abandoned, which is a division of Ser. No. 435,552, Oct. 21, 1982, Pat. No. 4,825,281.

[30] Foreign Application Priority Data

Oct. 28, 1981 [JP] Japan .................... 56-171443

[51] Int. Cl.⁵ ........................... H01L 21/328
[52] U.S. Cl. ...................... 437/31; 437/63; 437/73; 437/33; 437/239
[58] Field of Search .............. 437/31, 32, 33, 63, 437/73, 239; 357/34, 55

[56] References Cited

U.S. PATENT DOCUMENTS

| 4,016,007 | 4/1977 | Wada et al. | 437/31 |
| 4,099,987 | 7/1978 | Jambotka | 437/31 |
| 4,372,030 | 2/1983 | Saitoh | 437/33 |
| 4,378,630 | 4/1983 | Horng | 437/31 |

OTHER PUBLICATIONS

Colclaser, R. A., Microelectronics; Processing and Device Design, John Wiley & Sons, 1980, pp. 84–115.

Primary Examiner—Brian E. Hearn
Assistant Examiner—T. N. Quach
Attorney, Agent, or Firm—Antonelli, Terry, Stout & Kraus

[57] ABSTRACT

A method of manufacturing a bipolar transistor semiconductor device wherein the active regions of a transistor are formed in an opening provided in an insulating film, electrodes are led out by a polycrystalline silicon film formed on the insulating film, and the upper surfaces of the emitter and base electrodes and the exposed surface of the insulating film are substantially even.

25 Claims, 5 Drawing Sheets

METHOD OF MANUFACTURING A BIPOLAR TRANSISTOR

This application is a continuation of application Ser. No. 07/196,064, filed on May 17, 1988, now abandoned, which is a divisional of application Ser. No. 435,552, filed Oct. 21, 1982, now U.S. Pat. No. 4,825,281.

BACKGROUND OF THE INVENTION

1. Field of the Invention

The present invention relates to semiconductor devices, and more particularly to a semiconductor device which is capable of high-speed switching and which is well suited for forming multi-level interconnections owing to a small required area and reduced surface roughness.

2. Description of the Prior Art

As is well known, the switching speed of a bipolar transistor is greatly affected by the size of a base-collector junction. It has therefore been proposed to enhance the switching speed by making the size of the base-collector junction small.

FIG. 1 shows an example of such proposed device. A p-type substrate 11 has a surface region in which an n+-type buried layer 12 is provided. The surface of the n+-type buried layer 12 is formed with an insulating film (SiO$_2$ film) 17 having a plurality of openings. An n-p-n transistor which consists of an n-type collector 13, a p-type base 14 and an n-type emitter 15 is provided in a predetermined one of the openings. The collector 13 is connected to a collector electrode 10" through the n+-type buried layer 12, while the base 14 is connected to a base electrode 10' through a polycrystalline silicon film 18 which is deposited on the insulating film 17.

The bipolar transistor having such structure has the merit that, since the p-n junction between the base 14 and the collector 13 is small as apparent from FIG. 1, the parasitic capacitance is small enough to realize a high-speed switching operation.

Since, however, the polycrystalline silicon film 18 is used as a base lead-out electrode, i.e., the interconnection between the base electrode 10' and the intrinsic base region 14, and an emitter electrode 10, the base electrode 10' and an insulating film (SiO$_2$ film) 19 are formed on the polycrystalline silicon film 18, comparatively great steps (of approximately 1.5 μm) exist between the electrodes 10, 10' and the insulating film 19, and the collector electrode 10" and the insulating film 17 which are formed directly on the silicon substrate. Therefore, when multi-level interconnections are formed on the steps, the parts corresponding to the steps are liable to break, so that the reliability of the semiconductor device degrades drastically.

SUMMARY OF THE INVENTION

An object of the present invention is to solve the problem of the prior art described above, and to provide a semiconductor device which is capable of high-speed switching and whose topside has steps small enough to form multi-level interconnections with ease.

To the accomplishment of the object, the present invention releaves the steps in such a way that an epitaxial silicon layer is interposed between a silicon substrate and a metal electrode (10" in FIG. 1) which has heretofore been formed directly on the silicon substrate (a buried layer 12) and that a further insulating film is stacked on an insulating film (17) which has been formed on the silicon substrate.

DETAILED DESCRIPTION OF THE PREFERRED EMBODIMENTS

Embodiment 1

Figure 2:
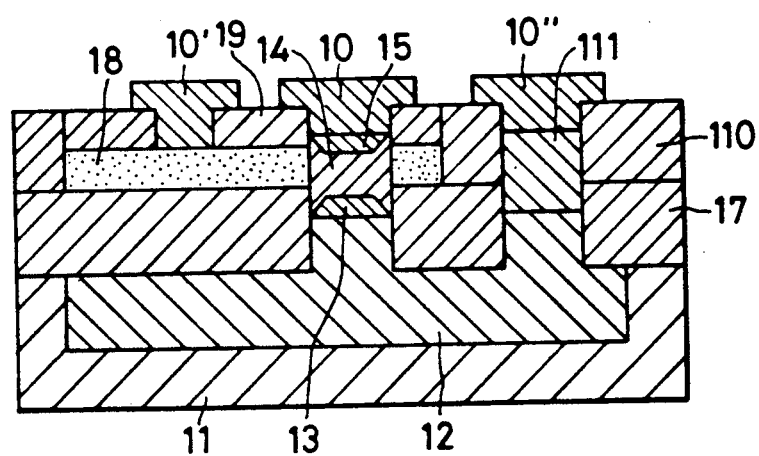
FIG. 2 is a view showing the sectional structure of the essential portions of an embodiment of the present invention.

FIG. 2 is a sectional view showing the essential portions of an embodiment of the present invention.

Figure 1:
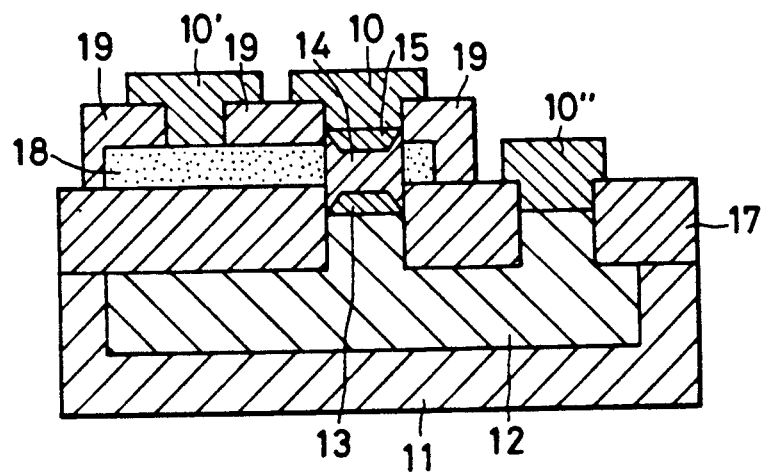
FIG. 1 is a view showing the sectional structure of the essential portions of a prior-art bipolar transistor.

Likewise to the transistor shown in FIG. 1, the bipolar transistor of FIG. 2 is a vertical n-p-n bipolar transistor which includes a collector 13, a base 14 and an emitter 15.

A base electrode 10' is connected to a side part of the base 14 through a polycrystalline silicon film 18, while an emitter electrode 10 is connected directly on the emitter 15.

Unlike the prior art, however, an epitaxial silicon layer 111 is interposed between a collector electrode 10" and an n+-type buried layer 12. In addition, a third insulating film (SiO$_2$ film) 110 is deposited on the exposed part of a first insulating film 17.

As apparent from FIG. 2, therefore, the upper surface of the collector electrode 10" becomes even with the upper surfaces of the emitter electrode 10 and the base electrode 10', and also the upper surfaces of a second insulating film 19 and the third insulating film 110 become even.

As a result, when compared with the prior-art bipolar transistor shown in FIG. 1, the bipolar transistor of the present invention has the steps reduced conspicuously and its topside flattened, so that the breaking of interconnection is feared much less. It is therefore possible to form the multi-level interconnections without anxiety.

Now, a method of manufacturing the transistor of the structure shown in FIG. 2 will be described by referring also to FIGS. 3a–3d.

Figure 3A:
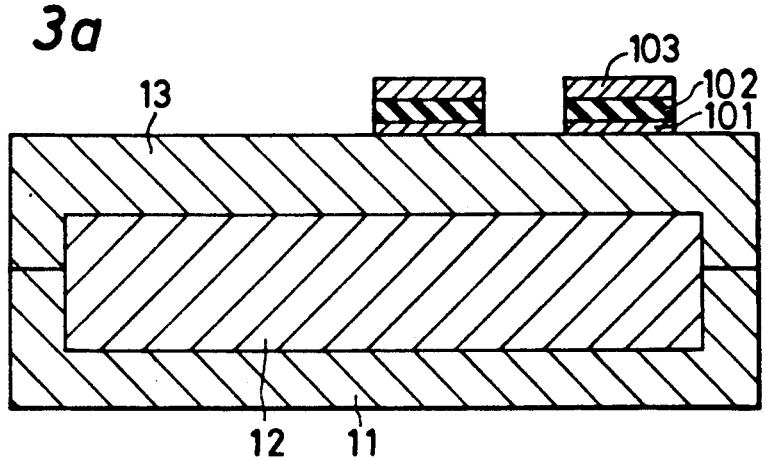
FIGS. 3a to 3d are processing step diagrams showing an example of a manufacturing process for the semiconductor device according to the present invention.

First, as shown in FIG. 3a, an n+-type buried layer 12 is formed on a p-type Si substrate 11 by a well-known expedient such as ion implantation and thermal diffusion, whereupon an epitaxial Si layer 13 is formed by the well-known vapor epitaxial growth technique. After an SiO$_2$ film 101, an Si$_3$N$_4$ film 102 and an SiO$_2$ film 103 have been stacked and formed on the whole surface, those parts of the deposited SiO$_2$ film 101, Si$_3$N$_4$ film 102 and SiO$_2$ film 103 which do not overlie parts for forming the active regions and collector lead-out region of a vertical transistor therein are removed by the reactive ion etching.

Figure 3B:
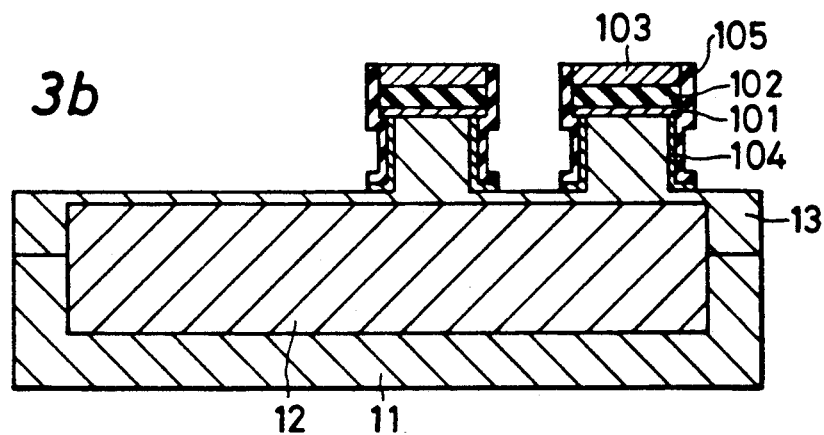

Subsequently, as shown in FIG. 3b, the exposed parts of the epitaxial Si layer 13 are etched and removed by the reactive ion etching by employing the three layers of the insulating films 101, 102 and 103 as a mask. In this case, the etching may be performed until the buried layer 12 is exposed, or so that the epitaxial Si layer 13 is slightly left on the upper surface of the buried layer 12 as illustrated in FIG. 3b.

The parts of the epitaxial Si layer 13 underlying the three-layer insulating films 101, 102 and 103 are side-etched by the wet etching, to form structures in which the three-layer insulating films 101, 102 and 103 overhang. Although this step of side etching is not always indispensable, it should preferably be carried out because the overhang structures are effective for leaving an $Si_3N_4$ film 105 on the side surfaces of parts of the epitaxial Si layer 13 in succeeding steps.

An $SiO_2$ film 104 is formed on the upper surface of the epitaxial Si layer 13 and the surfaces of the overhang structure parts thereof by the well-known thermal oxidation, whereupon the $Si_3N_4$ film 105 is further stacked and formed on the $SiO_2$ film 104 by the well-known CVD (chemical vapor deposition) process.

The $Si_3N_4$ film 105 deposited on parts other than the side surfaces of the three-layer insulating films 101, 102 and 103 and the parts of the epitaxial Si layer 13 underlying these insulating films is etched and removed, whereupon the exposed parts of the $SiO_2$ film 104 are further etched and removed. Thus, as illustrated in FIG. 3b, the $SiO_2$ film 104 and the $Si_3N_5$ film 105 remain on the side surfaces of the overhang structure parts of the epitaxial layer 13, and the $Si_3N_4$ film 105 remains on the side surfaces of the three-layer insulating films 101, 102 and 103.

Figure 3C:
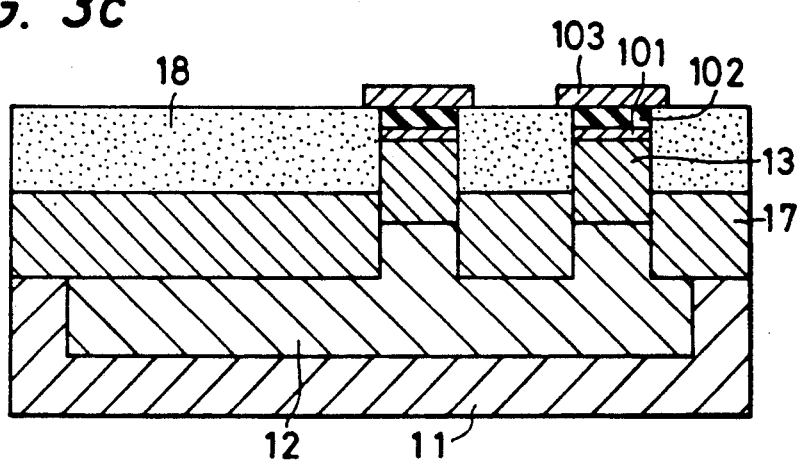

As shown in FIG. 3c, a thick $SiO_2$ film (having a thickness of about 1 μm) 17 is formed by the well-known thermal oxidation. Thereafter, the $SiO_2$ layer 104 and the $Si_3N_4$ film 105 are etched and removed. A polycrystalline silicon film 18 is deposited on the whole area, and is thereafter patterned so as to remove its parts deposited on the remaining parts of the $SiO_2$ film 103. Thus, as illustrated in FIG. 3c, a recess between the remaining parts of the epitaxial Si layer 13 is filled up with the polycrystalline silicon film 18.

Figure 3D:
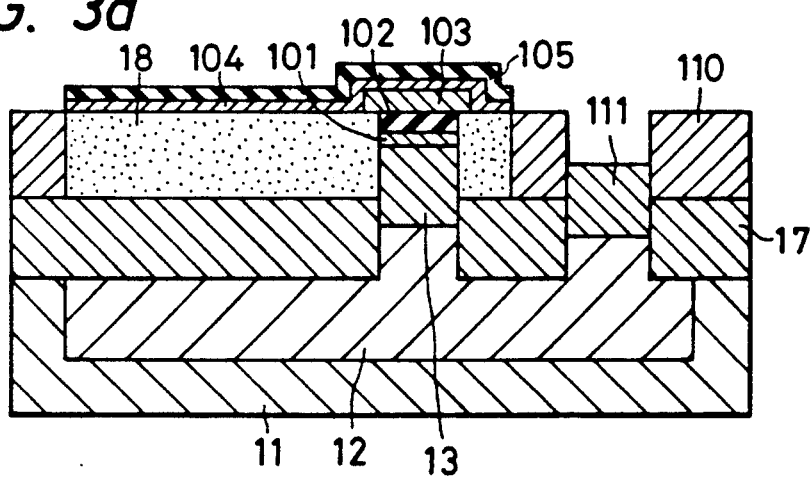

An $SiO_2$ film 104 and an $Si_3N_4$ film 105 are stacked and deposited on the whole area. Thereafter, etching is performed so that, as illustrated in FIG. 3d, the parts of the $SiO_2$ film 104 and the $Si_3N_4$ film 105 deposited on regions to form an emitter electrode and a base lead-out electrode therein may be left behind, whereas the parts deposited on the other regions may be removed.

The thermal oxidation is performed to oxidize the exposed parts of the polycrystalline silicon film 18 and to form an $SiO_2$ film 110.

The $SiO_2$ film 103, $Si_3N_4$ film 102 and $SiO_2$ film 101, which are deposited on the part to form the collector lead-out electrode therein, are successively etched and removed. Thereafter, the exposed epitaxial Si layer 13 is heavily doped with an impurity so as to form the collector lead-out semiconductor layer 111 of low resistance.

The $SiO_2$ film 104 and the $Si_3N_4$ film 105 used as a mask in the above oxidizing step are removed to expose the upper surface of the polycrystalline silicon film 18.

A p-type impurity is introduced into the exposed part of the polycrystalline silicon film 18 by the thermal diffusion or ion implantation, to turn the part into a low resistance. Thereafter, the surface of the polycrystalline silicon film 18 is oxidized to form an $SiO_2$ film 19. (FIG. 2)

After etching and removing the $SiO_2$ film 103, $Si_3N_4$ film 102 and $SiO_2$ film 101 deposited on the epitaxial Si layer 13, a base 14 and an emitter 15 are formed by a well-known method.

After desired parts of the $SiO_2$ film 19 have been etched to form contact windows, the emitter electrode 10, base electrode 10' and collector electrode 10" made of conductive metal films of Al or the like are formed. Then, the n-p-n vertical bipolar transistor shown in FIG. 2 is formed.

In this transistor, not only the upper surfaces of the emitter electrode 10, base electrode 10' and collector electrode 10", but also those of the $SiO_2$ film 19 and $SiO_2$ film 110 are substantially even. The steps are relieved much more than in the prior-art bipolar transistor shown in FIG. 1, and the multi-level interconnections are permitted.

The bipolar transistor of the embodiment has such other merits that, since the base-collector junction is small, the parasitic capacitance is low and a high switching speed is possible, and that, since the $SiO_2$ film 17 serves also for the isolation between the respectively adjacent transistors, any isolation means need not be added and the required area is small.

Embodiment 2

Figure 4:
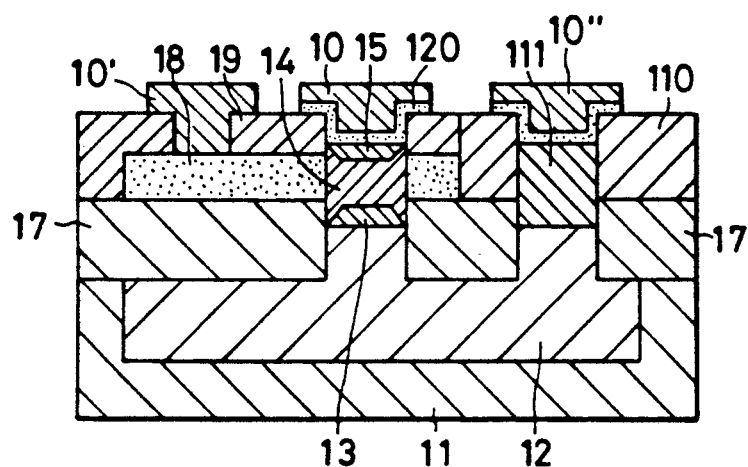
FIGS. 4 to 7 are sectional views showing different embodiments of the present invention, respectively.

An embodiment shown in FIG. 4 is such that a polycrystalline silicon film 120 is interposed between an emitter 15 and an emitter electrode 10.

With this measure, metal atoms which constitute the emitter electrode 10 are prevented from diffusing through the emitter 15 and entering a base 14.

Thus, the emitter 15 can be made as very thin as about 0.1–0.3μm, so that a still higher switching operation is permitted.

Embodiment 3

Figure 5:
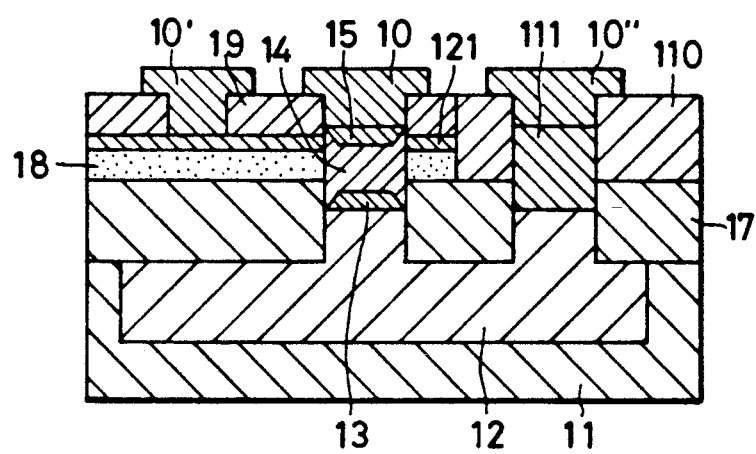

An embodiment shown in FIG. 5 is such that a film 121 of a metal silicide, e.g., $MoSi_2$ is disposed on a polycrystalline silicon film 18.

This measure lowers the interconnection resistance, enhances the switching speed and reduces the power consumption.

Embodiment 4

Figure 6:
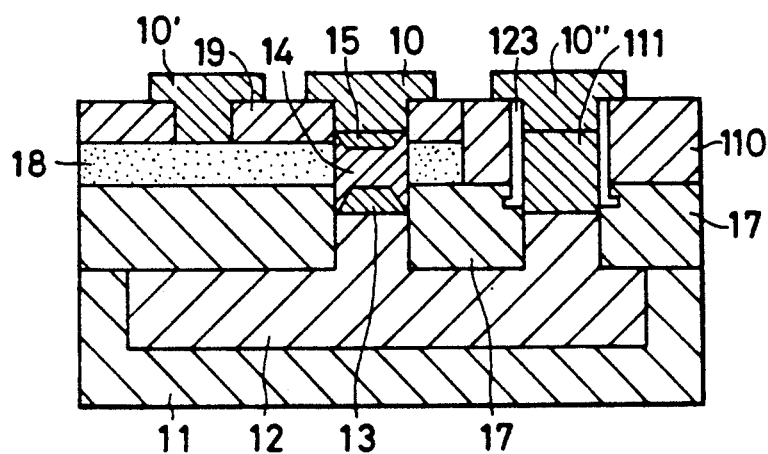

An embodiment shown in FIG. 6 has a structure in which a stacked film 123 consisting of an $SiO_2$ film 104 and an $Si_3N_4$ film 105 is left on the side surface of a collector leading-out epitaxial Si layer 111.

This measure is very effective for the miniaturization of the transistor as described below. In forming an $SiO_2$ film 110 by oxidizing a polycrystalline silicon film 18 by the thermal oxidation, the side part of an epitaxial Si layer is prevented from being oxidized, so that the collector leading-out epitaxial Si layer 111 does not become slender.

Embodiment 5

For the sake of convenience, all the foregoing embodiments have been explained as to the vertical transistors. Needless to say, however, the present invention is not restricted to such vertical transistors, but it is also applicable to a lateral transistor or to a semiconductor device in which a vertical transistor and a lateral transistor are formed on an identical semiconductor substrate.

Figure 7:
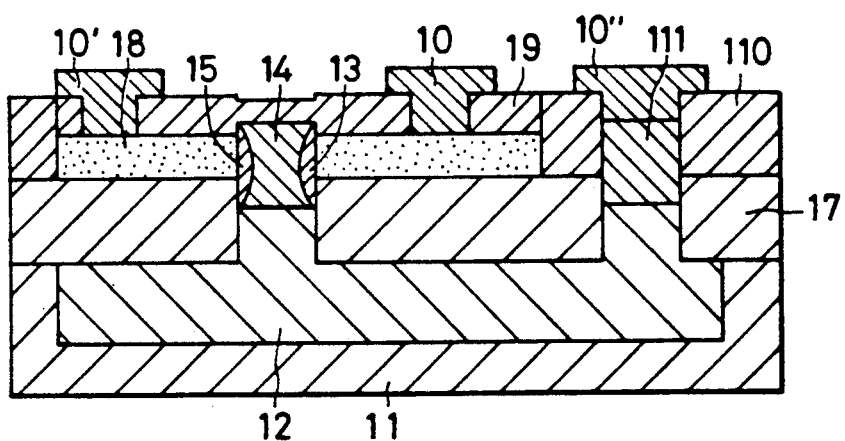

FIG. 7 shows an embodiment in which the present invention is applied to a lateral transistor.

As apparent from FIG. 7, in the case where the present invention is applied to the lateral transistor, an emitter and a collector are led out by interconnections of a polycrystalline silicon film 18, and a base is led out by a buried layer 12 and an epitaxial Si layer of low resistance 111.

The construction other than the collector 13, base 14 and emitter 15 is the same as in the case of the vertical transistor, and it can be formed by the same manufacturing steps as in the foregoing.

What is claimed is:

1. A method of manufacturing a semiconductor bipolar transistor device comprising the steps of:
    (a) selectively etching predetermined portions of a surface region of a semiconductor substrate to leave a first protruding portion of a first conductivity type and a second protruding portion of a first conductivity type;
    (b) forming a first insulating film on said substrate, by thermally oxidizing an exposed surface of the semiconductor substrate, including portions of side surfaces of each of the first and second protruding portions, and wherein said first insulating film has a first window and a second window which expose remaining portions of the side surfaces of said first and second protruding portions, respectively;
    (c) after forming said first insulating film, forming a conductive polycrystalline semiconductor film of second conductivity type, opposite to said first conductivity type, on the first insulating film, to contact with exposed remaining portions of the side surfaces of both said first and second protruding portions;
    (d) thermally oxidizing an exposed surface of said polycrystalline semiconductor film to form a second insulating film;
    (e) doping a surface region of said second protruding portion with an impurity of said first conductivity type to form a lower resistivity region;
    (f) after thermally oxidizing the exposed surface of the polycrystalline semiconductor film, doping a predetermined portion of said first protruding portion with an impurity of said second conductivity type to form a second region for said bipolar transistor device, said second region being electrically connected with said polycrystalline semiconductor film;
    (g) after thermally oxidizing the exposed surface of the polycrystalline semiconductor film, doping another predetermined portion of said first protruding portion, adjacent said second region, with an impurity of said first conductivity type to form a third region for said bipolar transistor device; and
    (h) forming electrodes connected with exposed upper surfaces of said first protruding portion, polycrystalline semiconductor film and second protruding portion, respectively.

2. A method of manufacturing a semiconductor bipolar device according to claim 1, wherein said step (a) is performed after a stacked film comprising a first silicon dioxide film, a first silicon nitride film and a second silicon dioxide film has been formed on predetermined areas of the surface region of said substrate for masking said predetermined areas during said etching to leave the first and second protruding portions.

3. A method of manufacturing a semiconductor bipolar device according to claim 1, wherein said thermal oxidation, to form the first insulating film, is applied after a silicon nitride film is formed on side surfaces of the first silicon dioxide film, the first silicon nitride film, the second silicon dioxide film and the second protruding portion.

4. A method of manufacturing a semiconductor bipolar device according to claim 1, wherein, in step (a), the selective etching is performed to leave first and second protruding portions, each protruding portion extending from a common lower surface and having an upper surface, the distance between the common lower surface and the upper surface for each protruding portion being substantially the same.

5. A method of manufacturing a semiconductor bipolar device according to claim 1, wherein said first and second protruding portions form a single bipolar transistor.

6. A method of manufacturing a semiconductor bipolar device according to claim 5, wherein a first region for said bipolar transistor device, of the first conductivity type, is provided in said first protruding portion.

7. A method of manufacturing a semiconductor bipolar device according to claim 6, wherein said semiconductor substrate includes an epitaxial layer, said first and second protruding portions including said epitaxial layer.

8. A method of manufacturing a semiconductor bipolar device according to claim 7, wherein said first region is provided in said epitaxial layer.

9. A method of manufacturing a semiconductor bipolar device according to claim 8, wherein said third region is provided on said second region.

10. A method of manufacturing a semiconductor bipolar device according to claim 8, wherein said third region is provided at a side of the second region.

11. A method of manufacturing a semiconductor bipolar device according to claim 9, wherein a first region for said bipolar transistor device, of the first conductivity type, is provided in said first protruding portion.

12. A method of manufacturing a semiconductor bipolar device according to claim 11, wherein said semiconductor substrate includes an epitaxial layer, said first and second protruding portions including said epitaxial layer.

13. A method of manufacturing a semiconductor bipolar device according to claim 12, wherein said first region is provided in said epitaxial layer.

14. A method of manufacturing a semiconductor bipolar device according to claim 1, wherein a remaining portion of the polycrystalline semiconductor film, after forming the second insulating film, is provided in contact with the exposed remaining portion of the side surface of the first protruding portion.

15. A method of manufacturing a semiconductor bipolar device according to claim 14, wherein the remaining portion of the polycrystalline semiconductor film is provided on a first portion of the first insulating film, wherein the exposed surface of the polycrystalline semiconductor film overlies a second portion of the first insulating film, and wherein the exposed surface of the polycrystalline semiconductor film is thermally oxidized, to form the second insulating film, such that an entire thickness of the polycrystalline semiconductor film overlying said second portion of the first insulating film, from the exposed surface, is thermally oxidized, whereby the second insulating film is provided on the second portion of the first insulating film.

16. A method of manufacturing a semiconductor bipolar device according to claim 15, wherein the exposed surface of the polycrystalline semiconductor film that is oxidized to form the second insulating film is the surface of a portion of the polycrystalline semiconductor film adjacent the second protruding portion.

17. A method of manufacturing semiconductor bipolar device according to claim 1, wherein after forming the third region and prior to forming the electrodes, a conductive polycrystalline semiconductor layer is provided on the third region, and wherein the forming the electrodes an electrode is connected to the conductive polycrystalline semiconductor layer.

18. A method of manufacturing a semiconductor bipolar device according to claim 1, wherein the conductive polycrystalline semiconductor film has a metal silicide layer disposed thereon.

19. A method of manufacturing a semiconductor bipolar device according to claim 1, wherein said first conductivity type and said second conductivity type are n-type and p-type, respectively.

20. A method of manufacturing a semiconductor bipolar device according to claim 1, wherein said second region is a base region of said bipolar transistor device.

21. A method of manufacturing a semiconductor bipolar device according to claim 1, wherein said third region is an emitter region of said bipolar transistor device.

22. A method of manufacturing a semiconductor bipolar device according to claim 1, wherein said polycrystalline semiconductor film comprises a polycrystalline silicon film, and said second insulating film comprises a silicon dioxide film.

23. A method of manufacturing a semiconductor bipolar device according to claim 4, wherein a distance from said common lower surface at each side of each of the first and second protruding portions, to said upper surface of each of the first and second protruding portions, is substantially the same.

24. A method of manufacturing a semiconductor bipolar device according to claim 23, wherein said first and second protruding portions form a single bipolar transistor.

25. A method of manufacturing a semiconductor bipolar device according to claim 1, wherein the surface region of the second protruding portion is doped with an impurity of the first conductivity type after the step of thermally oxidizing the exposed surface of the polycrystalline semiconductor film.

* * * * *